(12) United States Patent
Wan et al.

(10) Patent No.: US 12,061,416 B2
(45) Date of Patent: Aug. 13, 2024

(54) PHOTOCURABLE COMPOSITION COMPRISING A FULLERENE

(71) Applicant: CANON KABUSHIKI KAISHA, Tokyo (JP)

(72) Inventors: Fen Wan, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 473 days.

(21) Appl. No.: 17/377,691

(22) Filed: Jul. 16, 2021

(65) Prior Publication Data

US 2023/0021464 A1    Jan. 26, 2023

(51) Int. Cl.

| | |
|---|---|
| G03F 7/027 | (2006.01) |
| C08F 220/18 | (2006.01) |
| C08F 222/10 | (2006.01) |
| C08F 236/04 | (2006.01) |
| C08K 3/04 | (2006.01) |
| C08K 9/04 | (2006.01) |
| G03F 7/00 | (2006.01) |
| G03F 7/031 | (2006.01) |
| G03F 7/085 | (2006.01) |

(52) U.S. Cl.
CPC ........ *G03F 7/027* (2013.01); *C08F 220/1807* (2020.02); *C08F 222/103* (2020.02); *C08F 236/045* (2013.01); *C08K 3/045* (2017.05); *C08K 9/04* (2013.01); *G03F 7/0002* (2013.01); *G03F 7/031* (2013.01); *G03F 7/085* (2013.01)

(58) Field of Classification Search
CPC ........ G03F 7/027; G03F 7/031; G03F 7/0002; C08K 3/045
See application file for complete search history.

(56) References Cited

U.S. PATENT DOCUMENTS

| | | |
|---|---|---|
| 8,142,702 B2 | 3/2012 | Liu |
| 8,703,837 B2 | 4/2014 | Kawaguchi |
| 2003/0147613 A1 | 8/2003 | Khudyakov |
| 2004/0094752 A1* | 5/2004 | Ito .......................... G03F 7/0226 252/578 |
| 2005/0209408 A1 | 9/2005 | Lee |
| 2005/0227564 A1 | 10/2005 | Bond |
| 2008/0277826 A1* | 11/2008 | Chou ..................... B82Y 40/00 264/293 |
| 2013/0296455 A1* | 11/2013 | Maeda .................. C09B 23/143 548/366.4 |
| 2013/0306920 A1* | 11/2013 | Maeda .................. C09B 23/083 252/586 |
| 2016/0152860 A1 | 6/2016 | Lisitsin et al. |
| 2018/0030235 A1 | 2/2018 | Slep et al. |
| 2019/0023917 A1 | 1/2019 | Drazba et al. |
| 2020/0272050 A1 | 8/2020 | Robinson |

FOREIGN PATENT DOCUMENTS

| | | |
|---|---|---|
| JP | 2010-530641 A | 9/2010 |
| JP | 5594147 B2 | 9/2014 |

OTHER PUBLICATIONS

Kausar, A. et al. Waterborne Polyurethane Coated Polyamide/Fullerene Composite Films: Mechanical, Thermal and Flammability Properties. International Journal of Polymer Analysis and Characterization. Jan. 27, 2016, vol. 21, No. 4, p. 2, In 2-3, p. 11, In 15-23.
International Search Report & Written Opinion dated Oct. 12, 2022 with regard to International Application No. PCT/US22/32870.
Photo-crosslinked acrylates degradation kinetics, J Therm Anal Calorim (2009) 96:715-725.
Thermal stability and degradation of selected poly(alkyl methacrylates) used in the polymer industry J Therm Anal Calorim (2015) 119:1157-1161.
Fullerene C60 as stabiliser for acrylic polymers, Polymer Degradation and Stability 90 (2005) 28-33.

* cited by examiner

*Primary Examiner* — John S Chu
(74) *Attorney, Agent, or Firm* — Abel Schillinger, LLP

(57) ABSTRACT

A photocurable composition can comprise a polymerizable material, a fullerene or fullerene derivative in an amount of at least 0.2 wt % and not greater than 5.0 wt %, and a photoinitiator and may be adapted for AIP or NIL processing. A photo-cured layer made from the photocurable composition can have an improved thermal stability in comparison to a photo-cured layer made from the same photocurable composition except not containing a fullerene or fullerene derivative.

20 Claims, 2 Drawing Sheets

PHOTOCURABLE COMPOSITION COMPRISING A FULLERENE

FIELD OF THE DISCLOSURE

The present disclosure relates to a photocurable composition, particularly to a photocurable composition including a fullerene or fullerene derivative.

BACKGROUND

Inkjet Adaptive Planarization (IAP) uses flowable liquids (resists) to fill trenches, gaps, or other topography variations on a substrate and then are contacted by and cured under a superstrate to form a planar layer. In Nanoimprint Lithography (NIL), a template is filled with a liquid resist and after curing and further processing, the pattern of the template is transferred to the underlying substrate. During IAP and NIL processing the formed resists layers are often exposed to high temperatures during downstream processing, for example, during metal deposition.

There exists a need to improve the thermal stability of IAP and NIL resists, while keeping a delicate balance between other required properties, such as low viscosity and fast curing of the photocurable compositions, as well as good etch resistance and mechanical strength of the resists after curing.

SUMMARY

In one embodiment, a photocurable composition can comprise a polymerizable material, a fullerene or fullerene derivative, and a photo-initiator, wherein an amount of the fullerene or fullerene derivative is at least 0.2 wt % and not greater than 5 wt % based on the total weight of the photocurable composition; a viscosity of the photocurable composition is not greater than 60 mPas; and an amount of the polymerizable material is at least 70 wt % based on the total weight of the photocurable composition.

In one aspect of the photocurable composition, the fullerene or fullerene derivative can comprises a C60 fullerene (C60), phenyl-C61-butyric acid methyl ester (PCBM), or a combination thereof.

In a certain aspect, the amount of the fullerene or fullerene derivative may be not greater than 1 wt % based on the total weight of the photocurable composition.

In one aspect, the polymerizable material can comprise at least one multi-functional acrylate monomer.

In another aspect of the photocurable composition, the polymerizable material can comprise at least one multi-functional vinylbenzene. In a certain aspect, the multi-functional vinylbenzene may comprise divinylbenzene.

In yet another aspect, the polymerizable material of the photocurable composition can comprise at least one multi-functional vinylbenzene and at least one multi-functional acrylate monomer.

In a particular aspect of the photocurable composition, the polymerizable material can comprise at least one difunctional vinylbenzene and at least one trifunctional acrylate monomer.

In a certain particular aspect, the polymerizable material can comprise divinylbenzene and trimethylolpropane triacrylate.

In another particular aspect of the photocurable composition, the polymerizable material can comprise at least 30 wt % of the multi-functional vinylbenzene based on the total weight of the polymerizable material and at least 30 wt % of the multi-functional acrylate monomer based on the total weight of the polymerizable material.

In one aspect of the photocurable composition, a weight % ratio of the multi-functional vinylbenzene to the multi-functional acrylate monomer can range from 1:3 to 3:1.

In another aspect, the polymerizable material of the photocurable composition can comprise at least one difunctional vinylbenzene and at least one trifunctional acrylate monomer. In a certain particular aspect, the polymerizable material comprises divinylbenzene and trimethylolpropane triacrylate.

In a further aspect, the photocurable composition can be adapted to convert to a solid material after photo-curing, wherein a weight loss after curing is not greater than 10 wt % based on the total weight of the photocurable composition.

In yet a further aspect, the photocurable composition can be essentially free of a solvent.

In another embodiment, a laminate can comprise a substrate and a photo-cured layer overlying the substrate, wherein the photo-cured layer may be formed from the above described photocurable composition of the present disclosure.

In one aspect of the laminate, an initial degradation temperature of the photo-cured layer $T_f(X)$ can be at least 10° C. higher than an initial degradation temperature of a comparative photo-cured layer $T_c(X)$, the comparative photo-cured layer being made from a comparative photocurable composition containing the same polymerizable material and photo-initiator as the photocurable composition but no fullerene or fullerene derivative.

In a certain aspect of the laminate, the initial degradation temperature $T_f(X)$ of the photo-cured layer can be at least 320° C.

In another embodiment, a method of forming a photo-cured layer on a substrate, can comprise: applying a layer of a photocurable composition on the substrate, wherein the photocurable composition can comprise a polymerizable material, a fullerene or fullerene derivative, and a photoinitiator, and wherein an amount of the fullerene or fullerene derivative can be at least 0.2 wt % and not greater than 5 wt % based on the total weight of the photocurable composition; a viscosity of the photocurable composition can be not greater than 60 mPa s; and an amount of the polymerizable material can be at least 70 wt % based on the total weight of the photocurable composition; bringing the photocurable composition into contact with a superstrate or an imprint template; irradiating the photocurable composition with light to form a photo-cured layer; and removing the superstrate or the imprint template from the photo-cured layer.

In one aspect of the method, the fullerene of fullerene derivative can comprise a C60 fullerene (C60), phenyl-C61-butyric acid methyl ester (PCBM), or a combination thereof.

In another aspect of the method, the initial degradation temperature $T_f(X)$ of the photo-cured layer can be at least 320° C.

In a further embodiment, a method of manufacturing an article can comprise: applying a layer of a photocurable composition on a substrate, wherein the photocurable composition can comprise a polymerizable material, a fullerene or fullerene derivative, and a photoinitiator, and wherein an amount of the fullerene or fullerene derivative can be at least 0.2 wt % to not greater than 5 wt % based on the total weight of the photocurable composition; a viscosity of the photocurable composition may be not greater than 60 mPa s; and an amount of the polymerizable material can be at least 70 wt % based on the total weight of the photocurable composition; bringing the photocurable composition into contact with a superstrate or an imprint template; irradiating the photocurable composition with light to form a photo-cured layer; removing the superstrate or the imprint template from the photo-cured layer; forming a pattern on the substrate; processing the substrate on which the pattern has been formed in the forming; and manufacturing an article from the substrate processed in the processing.

BRIEF DESCRIPTION OF THE DRAWINGS

Embodiments are illustrated by way of example and are not limited in the accompanying figures.

DETAILED DESCRIPTION

Figure 1:
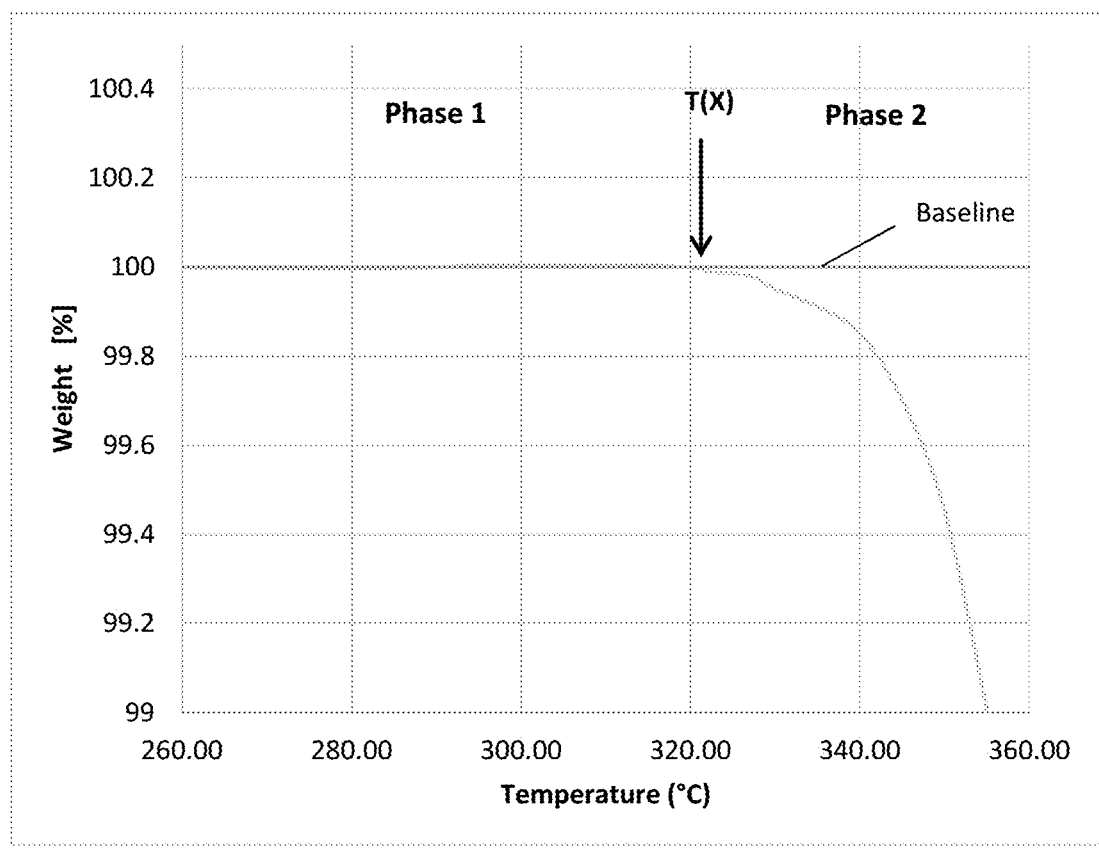
FIG. 1 includes a graph illustrating a TGA curve of a photo-cured material according to one embodiment, showing phase 1, the initial degradation temperature T(X), and phase 2.

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a photocurable composition comprising a polymerizable material, a fullerene or fullerene derivative, and a photo-initiator. The photocurable composition can be adapted for AIP or NIL processing and may have a viscosity of not greater than 60 mPa s, an amount of polymerizable material of at least 70 wt % based on the total weight of the photocurable composition, and an amount of the fullerene or fullerene derivative of at least 0.2 wt % and not greater than 5.0 wt % based on the total weight of the photocurable composition.

As used herein, the term "fullerene" relates to a molecule which is an allotrope of carbon, wherein the carbon atoms are connected by single and double bonds and form a three-dimensional closed mesh in form of ball, an ellipsoid, or tube.

In one embodiment, the fullerene contained in the photocurable composition of the present disclosure can be C60 fullerene. In C60 fullerene, sixty carbon atoms are connected by single and double bonds forming a closed mesh in form of a ball, resembling the shape of a soccer ball, also informally called buckyball or buckminsterfullerene.

In another embodiment, a fullerene derivative can be included in the photocurable composition. A non-limiting example of a fullerene derivative can be a derivative of C60 fullerene. In a certain particular aspect, a derivative of C60 fullerene may be phenyl-C61-butyric acid methyl ester (PCBM), CAS 160848-22-6.

The fullerene of fullerene derivative may not be limited to C60 fullerene and derivatives thereof, and can be selected from fullerenes having a smaller of higher number of carbon atoms, for example C20 fullerene, or C70 fullerene, or C82 fullerene, or derivatives thereof.

It has been surprisingly observed that a small amount of a fullerene or a fullerene derivative can improve the thermal stability of a photo-cured layer made from the photocurable composition of the present disclosure. Not being bound to theory, it is assumed that the presence of small amounts of a fullerene or fullerene derivative may behave as a radical sponge and can react with radicals formed by the thermal degradation of polyacrylate structures and thereby slow down the degradation. This can be useful for acrylate-based resist layers in AIP or NIL downstream processing, which often involves exposure to high temperatures.

In aspects, the amount of fullerene or fullerene derivative can be not greater than 5.0 wt % based on the total weight of the photocurable composition, such as not greater than 4.5 wt %, not greater than 4.0 wt %, not greater than 3.5 wt %, not greater than 3.0 wt %, not greater than 2.5 wt %, not greater than 1.5 wt %, not greater than 1.0 wt %, or not greater than 0.8 wt %, or not greater than 0.5 wt %. In other aspects, the amount of fullerene or fullerene derivative can be at least 0.1 wt %, or at least 0.2 wt %, or at least 0.3 wt %. In a particular embodiment, the amount of fullerene or fullerene derivative can be between 0.2 wt % and 2.0 wt %, or between 0.2 wt % and 1.0 wt % based on the total weight of the photocurable composition.

In a certain embodiment, the polymerizable material of the photocurable composition of the present disclosure can include a combination of at least two polymerizable monomers, oligomers, polymers, or any combination thereof. In one aspect, the polymerizable material can comprise at least one mono-functional acrylate monomer and at least one multi-functional acrylate monomer. As used herein, the term acrylate monomer relates to unsubstituted or alkyl-substituted acrylate monomers, for example methacrylate monomers.

The amount of polymerizable material in the photocurable composition can be at least 50 wt % based on the total weight of the photocurable composition, such as at least 60 wt %, at least 70 wt %, at least 75 wt %, at least 80 wt %, at least 85 wt %, at least 90 wt %, or at least 95 wt %. In another aspect, the amount of polymerizable material may be not greater than 99 wt %, such as not greater than 98 wt %, or not greater than 97 wt %, or not greater than 95 wt % based on the total weight of the photocurable composition.

The amount of polymerizable material can be a value between any of the minimum and maximum values noted above. In a particular aspect, the amount of the polymerizable material can be at least 70 wt % and not greater than 95 wt %, or at least 85 wt % and not greater than 98 wt %.

In a further embodiment, the polymerizable material of the photocurable composition can comprise at least one multi-functional acrylate monomer, such as bi-functional, a trifunctional, or a tetra-functional acrylate monomer. Non-limiting examples of multi-functional monomers can be bisphenol A dimethacrylate (BPADMA), bisphenol A diacrylate (BPADA), 3-Methyl-1,5-pentanediol diacrylate, 1,3-Adamantanediol diacrylate, Phenylene diacrylate, 2-Propenoic acid, 1-phenyl-1,2-ethanediyl ester, trimethylolpropane triacrylate, Trimethylolpropane(EO)3 Triacrylate, Pentaerythritol tetraacrylate or any combination thereof.

In another embodiment, the polymerizable material can include at least one multi-functional vinylbenzene. In a certain particular aspect, the multi-functional vinylbenzene can include divinylbenzene.

In a certain embodiment, the polymerizable material can comprise at least one multi-functional vinylbenzene and at least one multi-functional acrylate monomer. In one aspect, the amount of the multi-functional vinylbenzene can be at least 30 wt %, or at least 35 wt %, or at least 40 wt %, or at least 45 wt % based on the total weight of the polymerizable material, and the amount of the multi-functional vinylbenzene may be at least 30 wt %, or at least 35 wt %, or at least 40 wt %, or at least 45 wt % based on the total weight of the polymerizable material.

In yet another aspect, the weight % ratio of the multi-functional vinylbenzene to the multi-functional acrylate monomer can ranges from 1:3 to 3:1, or from 1:2 to 2:1, or from 1.5:1 to 1:1.5. In a certain particular aspect, the weight % ratio of the multi-functional vinylbenzene to the multi-functional acrylate monomer can be about 1:1.

In one aspect, the polymerizable material can comprise at least one difunctional vinylbenzene and at least one trifunctional acrylate monomer. In a particular non-limiting example, the polymerizable material can include divinylbenzene and trimethylolpropane triacrylate.

As also shown in the examples, it has been surprisingly observed that the presence of a small amount of a fullerene or fullerene derivative can increase the thermal stability of a photo-cured layer formed from the photocurable composition. In one aspect, the thermal stability of the photo-cured layer can be investigated by dynamic thermogravimetry via thermal gravimetric analysis (TGA) by following the weight loss of a sample with increasing temperature at a controlled heat rate. As illustrated in FIG. 1, in phase 1 of the TGA curve, until the initial degradation temperature T(X) is reached, the weight loss is almost linear, and can be explained due to the evaporation of moisture, unreacted monomers, and other small molecules that would not affect the polymer network performance. As used herein, the initial degradation temperature T(X), also called onset degradation temperature, is the point in the TGA curve wherein a deflection from the established baseline of phase 1 is first observed, which happens prior to the degradation of the sample. The initial degradation temperature T(X) is obtained herein by measuring a TGA curve according to ASTM E2550 and determining T(X) as illustrated in FIG. 1. T(X) corresponds to the beginning of phase 2, wherein with further increasing temperature the increase in weight loss can be attributed to degradation reactions of the polymer matrix. The initial degradation temperature T(X) can be a key factor to evaluate the thermal stability of a material and to provide information under which temperature conditions a material can be reliably used.

In one aspect, the presence of a fullerene can increase the initial degradation temperature of the photo-cured layer of the present disclosure $T_f(X)$ in comparison to the initial degradation temperature of a comparative photo-cured layer $T_c(X)$ made from the same photocurable composition but not containing a fullerene or fullerene derivative by at least 10° C., or at least 15° C., or at least 20° C., or at least 25° C., or at least 30° C.

Figure 2:
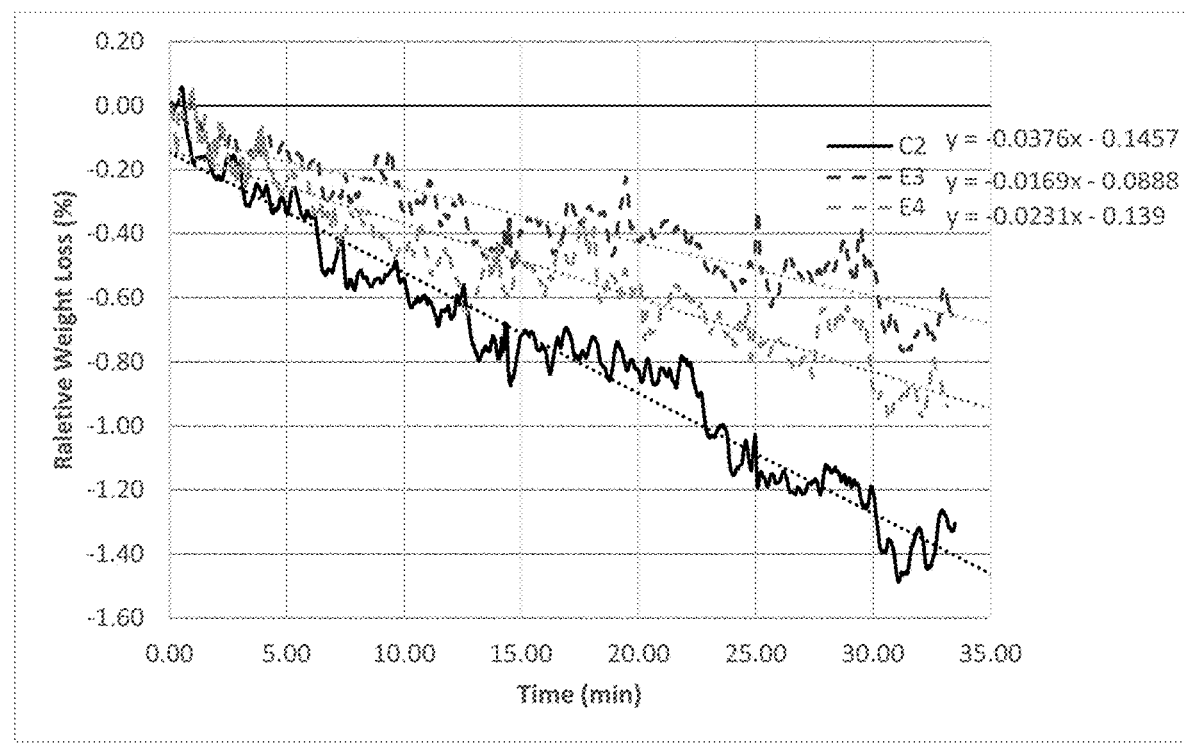
FIG. 2 includes a graph showing isothermal TGA curves of photo-cured samples E3 and E4 according to one embodiment and of comparative sample C2.

In another aspect, the thermal stability of a photo-cured layer can be evaluated by the weight loss at a given temperature. For example, the weight loss of a material sample can be followed at fixed temperature of 350° C. over the time of 30 minutes, as shown in FIG. 2 (see also Example 2 below). By measuring the slope of the curve showing the decrease of the weight loss, a good evaluation and comparison can be made about the stability of a material at a given temperature.

Important for the selection of monomers is the aspect of maintaining a low viscosity of the polymerizable composition before curing. In one embodiment, the viscosity of the curable composition can be not greater than 60 mPa s, such as not greater than 50 mPa·s, not greater than 40 mPa·s, not greater than 30 mPa·s, not greater than 25 mPa·s, not greater than 20 mPa~s, not greater than 15 mPa·s, or not greater than 10 mPa·s. In other certain embodiments, the viscosity may be at least 1 mPa·s, such as at least 3 mPa·s, such as at least 5 mPa·s, or at least 8 mPa·s. In a particularly preferred aspect, the photocurable composition can have a viscosity of not greater than 20 mPa·s. As used herein, all viscosity values relate to viscosities measured at a temperature of 23° C. with the Brookfield method using a Brookfield Viscometer.

In yet a further aspect, after photo-curing the photocurable composition, the glass transition temperature of the photo-cured layers can be at least 70° C., or at least 80° C., or at least 90° C.

In a further aspect, the photocurable composition of the present disclosure may be essentially free of a solvent. As used herein, the term solvent relates to a compound which can dissolve or disperse the polymerizable monomers but does not itself polymerize during the photocuring of the photocurable composition. The term "essentially free of a solvent" means herein an amount of solvent being not greater than 5 wt % based on the total weight of the photocurable composition. In a certain particular aspect, the amount of a solvent can be not greater than 3 wt %, not greater than 2 wt %, not greater than 1 wt %, or the photocurable composition can be free of a solvent, except for unavoidable impurities.

In a certain aspect, the photocurable composition is essentially free of particles, such that all components of the composition are dissolved. Essentially free of particles means herein that the composition contains no particles having a size greater than 5 nm. Being essentially free of particles can be often a process requirement during NIL or IAP processing to insure a high quality of a formed resist.

In order to initiate the photo-curing of the composition if exposed to light, one or more photoinitiators can be included in the photocurable composition. In one aspect, the amount of the one or more photoinitiators can be between 0.5 wt % and 4 wt % based on the total weight of the photocurable composition.

In a certain aspect, the curing can be also conducted by a combination of light and heat curing.

The photocurable composition can further contain one or more optional additives. Non-limiting examples of optional additives can be stabilizers, dispersants, solvents, surfactants, inhibitors or any combination thereof. In a certain aspect, the amount of one or more surfactants can be between 0.3 wt % and 5 wt % based on the total weight of the photocurable composition.

In one embodiment, the photocurable composition can be applied on a substrate to form a photo-cured layer. As used herein, the combination of substrate and photo-cured layer overlying the substrate is called a laminate.

In one aspect, the initial degradation temperature of the photo-cured layer $T_f(X)$ can be at least 10° C. higher than the initial degradation temperature of a comparative photo-cured layer $T_c(X)$, wherein the comparative photo-cured layer is made from a photocurable composition not containing a fullerene or a fullerene derivative and otherwise contains the same photocurable composition for making the photocurable layer, such as containing the same polymerizable material, the same photo-initiator and the same any optional additives.

In a certain particular aspect, the initial degradation temperature $T_f(X)$ of the photo-cured layer can be at least 320° C., such as at least 330° C., at least 340° C., or at least 350° C.

The present disclosure is further directed to a method of forming a photo-cured layer. The method can comprise applying a layer of the photocurable composition described above over a substrate, bringing the photocurable composition into contact with an imprint template or superstrate; irradiating the photocurable composition with light to form a photo-cured layer; and removing the imprint template or the superstrate from the photo-cured layer.

The substrate and the solidified layer may be subjected to additional processing, for example, an etching process, to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like.

The photo-cured layer may be further used as an interlayer insulating film of a semiconductor device, such as LSI, system LSI, DRAM, SDRAM, RDRAM, or D-RDRAM, or as a resist film used in a semiconductor manufacturing process.

As further demonstrated in the examples, it has been surprisingly observed that the inclusion of a minor amount of a fullerene or fullerene derivative in a photocurable composition can increase the thermal stability of the photo-cured layers formed after curing the photocurable composition, which can have advantages for NIL and AIP downstream processing involving high temperatures.

EXAMPLES

The following non-limiting examples illustrate the concepts as described herein.

Example 1

Preparing of Photocurable Compositions

Photocurable compositions were prepared including C60 fullerene (C60) or phenyl-C61-butyric acid methyl ester (PCBM) in amounts of about 0.2 and 0.5 wt %, respectively. Each composition contained the same polymerizable material of 50 parts benzyl acrylate, 30 parts 1-naphthyl acrylate, and 20 parts bisphenol A dimethacrylate. Furthermore, each composition contained 3 parts Irgacure 819 as photoinitiator, and as surfactants 0.5 parts Chemguard 5554 and 0.5 parts FS2000M2. A comparative composition (C1) was made not including C60 fullerene or PCBM, but having the same polymerizable material, the same photo-initiator and the same surfactants. A summary of the photocurable compositions is shown in Table 1.

TABLE 1

| Ingredient | E1 | E2 | C1 |
| --- | --- | --- | --- |
| Benzyl Acrylate | 50 | 50 | 50 |
| 1-Naphthyl Acrylate | 30 | 30 | 30 |
| Bisphenol A dimethacrylate | 20 | 20 | 20 |
| C60 | 0.2 | 0 | 0 |
| PCBM | 0 | 0.5 | 0 |
| Irgacure 819 | 3 | 3 | 3 |
| Chemguard S554 | 0.5 | 0.5 | 0.5 |
| FS2000M2 | 0.5 | 0.5 | 0.5 |
| Total parts of polymerizable material | 100 | 100 | 100 |
| Viscosity [mPa s] | 9 | 9.2 | 8.5 |
| T(X) [° C.] | 215 | 225 | 204 |

Photo-cured layers were prepared from the photocurable compositions by applying a liquid film of the photocurable compositions of about 300 microns thickness on a glass substrate, subjecting the liquid film to a UV light intensity of 15 mW/cm$^2$ and curing it for 667 seconds, which corresponds to a curing energy dosage of 10 J/cm$^2$.

Measurement of Thermal Stability

The thermal stability of the photo-cured layers was investigated via dynamic thermal gravimetric analysis (TGA) using a LINSEIS STA PT1000 instrument (Linseis Messgeraete GmbH, Germany). All measurements were conducted under nitrogen at a rate of 5 liter per hour.

For the TGA measurements, 25-35 mg of the photo-cured sample was placed in a crucible and the initial weight recorded. A reference crucible was used to monitor the weight change of the crucible due to the variation of the temperature. The sample was heated at a rate of 20° C./min and the weight loss of the sample with increasing temperature was recorded at an interval of 1 second. The relative weight percent change was calculated by using the weight loss divided by the total original weight of the sample.

Table 1 also summarizes the initial degradation temperature $T_f(X)$ for the photo-cured layers of samples E1, E2, and T(X) for comparative sample C1. It can be seen that the presence of only 0.2 wt % fullerene increased the initial degradation temperature by 11° C. (from 204° C. to 215° C.), and the presence of 0.5 wt % PCBM increased the initial degradation temperature by 21° C. (from 204° C. to 225° C.). The initial degradation temperature for each curve was identified as illustrated in FIG. 1, by determining the point of deflection from an established baseline of phase 1 of the TGA curve.

The viscosities of the samples were measured at 23° C., using a Brookfield Viscometer LVDV-II+Pro at 200 rpm, with a spindle size #18. For the viscosity testing, about 6-7 mL of sample liquid was added into the sample chamber, enough to cover the spindle head. For all viscosity testing, at least three measurements were conducted and an average value was calculated.

Example 2

A further set of photocurable compositions was made with C60 fullerene (C60) and phenyl-C61-butyric acid methyl ester (PCBM) as described in Example 1, but with a different polymerizable material. The polymerizable material contained in even weight % amounts trimethylolpropane triacrylate (SR351HP from Sartomer Americas) and divinylbenzene (DVB). A summary of the photocurable compositions summarizing the ingredients in parts is shown in Table 2.

TABLE 2

| Ingredient | E3 | E4 | C2 |
|---|---|---|---|
| Trimethylolpropane triacrylate | 50 | 50 | 50 |
| Divinylbenzene | 50 | 50 | 50 |
| C60 | 0.5 | 0 | 0 |
| PCBM | 0 | 0.5 | 0 |
| Irgacure 907 | 2 | 2 | 2 |
| FS2000M1 | 1 | 1 | 1 |
| Total parts polymerizable material | 100 | 100 | 100 |
| $T_f(X)$ [° C.] | 340 | 350 | 316 |

Photo-cured layers were prepared from the photocurable compositions the same way as in Example 1, and samples of the photo-cured layers were analyzed via TGA analysis, as also described in Example 1.

It can be seen from Table 2 that the presence of minor amounts of C60 fullerene or PCBM lead to a strong increase of the initial degradation temperature $T_f(X)$. In sample E3, the thermal degradation temperature increased by 24° C., and in sample E4 by 34° C. in comparison to sample C2 which did not contain C60 fullerene or PCBM. A thermal degradation temperature in the range of 340-350° C. can be highly valuable for high demand AIP or NIL processing, involving steps wherein the materials are exposed to high temperatures.

Isothermal Thermogravimetry

Isothermal thermogravimetry was conducted with samples of the photo-cured layers of E1, E2, and C2 at a constant temperature of 350° C. for 30 minutes. The measurements were conducted with the same TGA instrument described above and also under nitrogen. For each measurement, 25-35 mg of the photo-cured sample was put in the crucible and the initial weight was recorded. The temperature was quickly raised to 350° C. (within 20 min). When the temperature of 350° C. was reached, the weight loss was recorded over the time period of 30 minutes. FIG. 2 shows the relative weight loss of photo-cured samples E3, E4, and C2 at a constant temperature of 350° C. over the time period of 30 minutes. It can be seen that Sample C2 had a much faster weight loss than samples E3 and E4. The speed of the weight loss was characterized by converting the recorded data curve for each sample into a straight line, and expressing the slope of the line in form of a K value in % weight loss/minute. The K value can be an indication of the thermal stability of the samples, the higher the K-value, the less stable the sample. As shown in Table 4, comparative sample C2 had the highest K value, while samples E3 and E4 had lower K-values. By normalizing the K-values such that the comparative sample is set to 1, it can be seen that sample E3 has an about 20% better thermal stability than the comparative sample, and sample E3 was about 35% more stable.

TABLE 3

| Sample | Isostatic Temperature [° C.] | Slope K value [% weight loss/minute] | Normalized K value |
|---|---|---|---|
| E3 | 350 | 0.017 | 0.45 |
| E4 | 350 | 0.023 | 0.61 |
| C2 | 350 | 0.038 | 1 |

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A photocurable composition comprising a polymerizable material, a fullerene or fullerene derivative, and a photo-initiator, wherein
   an amount of the fullerene or fullerene derivative is at least 0.2 wt % and not greater than 5 wt % based the total weight of the photocurable composition;
   a viscosity of the photocurable composition is not greater than 60 mPa s;
   the polymerizable material comprises at least one multi-functional vinylbenzene in an amount of at least 45 wt % based on the total weight of the polymerizable material; and
   an amount of the polymerizable material is at least 90 wt % based on the total weight of the photocurable composition.

2. The photocurable composition of claim 1, wherein the fullerene or fullerene derivative comprises a C60 fullerene (C60), phenyl-C61-butyric acid methyl ester (PCBM), or a combination thereof.

3. The photocurable composition of claim 1, wherein the amount of the fullerene or fullerene derivative is not greater than 1 wt % based on the total weight of the photocurable composition.

4. The photocurable composition of claim 1, wherein the polymerizable material further comprises at least one multi-functional acrylate monomer.

5. The photocurable composition of claim 1, wherein the at least one multi-functional vinylbenzene comprises divinylbenzene.

6. The photocurable composition of claim 4, wherein the polymerizable material consists essentially of the at least one multi-functional vinylbenzene and the at least one multi-functional acrylate monomer.

7. The photocurable composition of claim 4, wherein the polymerizable material comprises at least 50 wt % of the multi-functional vinylbenzene based on the total weight of the polymerizable material and at least 30 wt % of the multi-functional acrylate monomer based on the total weight of the polymerizable material.

8. The photocurable composition of claim 4, wherein a weight % ratio of the multi-functional vinylbenzene to the multi-functional acrylate monomer is about 1:1.

9. The photocurable composition of claim 4, wherein the polymerizable material comprises at least one difunctional vinylbenzene and at least one trifunctional acrylate monomer.

10. The photocurable composition of claim 9, wherein the polymerizable material comprises divinylbenzene and trimethylolpropane triacrylate.

11. The photocurable composition of claim 1, wherein the photocurable composition is adapted to convert to a solid material after photo-curing with a weight loss of not greater than 10 wt % after photo-curing.

12. The photocurable composition of claim 1, wherein the photocurable composition is essentially free of a solvent.

13. A laminate comprising a substrate and a photo-cured layer overlying the substrate, wherein the photo-cured layer is formed from the photocurable composition of claim 1.

14. The laminate of claim 13, wherein an initial degradation temperature of the photo-cured layer $T_f(X)$ is at least 10° C. higher than an initial degradation temperature of a comparative photo-cured layer $T_c(X)$, the comparative photo-cured layer being made from a comparative photocurable composition containing the same polymerizable material and photo-initiator as the photocurable composition but no fullerene or fullerene derivative.

15. The laminate of claim 14, wherein the initial degradation temperature $T(X)$ of the photo-cured layer is at least 320° C.

16. A method of forming a photo-cured layer on a substrate, comprising:
applying a layer of a photocurable composition on the substrate, wherein the photocurable composition comprises a polymerizable material, a fullerene or fullerene derivative, and a photoinitiator, and wherein an amount of the fullerene or fullerene derivative is at least 0.2 wt % and not greater than 5 wt % based on the total weight of the photocurable composition; a viscosity of the photocurable composition is not greater than 60 mPa s; the polymerizable material comprises at least one multi-functional vinylbenzene in an amount of at least 45 wt % based on the total weight of the polymerizable material; and an amount of the polymerizable material is at least 90 wt % based on the total weight of the photocurable composition;
bringing the photocurable composition into contact with a superstrate or an imprint template;
irradiating the photocurable composition with light to form a photo-cured layer; and
removing the superstrate or the imprint template from the photo-cured layer.

17. The method of claim 16, wherein the fullerene compound comprises a C60 fullerene (C60), phenyl-C61-butyric acid methyl ester (PCBM), or a combination thereof.

18. The method of claim 16, wherein an initial degradation temperature $T_f(X)$ of the photo-cured layer is at least 320° C.

19. A method of manufacturing an article, comprising:
applying a layer of a photocurable composition on a substrate, wherein the photocurable composition comprises a polymerizable material, a fullerene or fullerene derivative, and a photoinitiator, and wherein an amount of the fullerene or fullerene derivative is at least 0.2 wt % to not greater than 5 wt % based on the total weight of the photocurable composition; a viscosity of the photocurable composition is not greater than 60 mPa s; the polymerizable material comprises at least one multi-functional vinylbenzene in an amount of at least 45 wt % based on the total weight of the polymerizable material; and an amount of the polymerizable material is at least 90 wt % based on the total weight of the photocurable;
bringing the photocurable composition into contact with a superstrate or an imprint template;
irradiating the photocurable composition with light to form a photo-cured layer;
removing the superstrate or the imprint template from the photo-cured layer;
forming a pattern on the substrate;
processing the substrate on which the pattern has been formed in the forming; and
manufacturing an article from the substrate processed in the processing.

20. The photocurable composition of claim 2, wherein the photocurable composition includes a fullerene derivative, the fullerene derivative including phenyl-C61-butyric acid methyl ester.

* * * * *